(12) United States Patent
Aoki

(10) Patent No.: US 12,744,510 B2
(45) Date of Patent: Sep. 22, 2026

(54) VIBRATOR DEVICE WITH SEMICONDUCTOR ELEMENT AND VIBRATOR

(71) Applicant: SEIKO EPSON CORPORATION, Tokyo (JP)

(72) Inventor: Shinya Aoki, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 978 days.

(21) Appl. No.: 17/988,178

(22) Filed: Nov. 16, 2022

(65) Prior Publication Data

US 2023/0155568 A1 May 18, 2023

(30) Foreign Application Priority Data

Nov. 18, 2021 (JP) ................................ 2021-187670

(51) Int. Cl.
*H03H 9/05* (2006.01)
*H03H 9/10* (2006.01)
*H03H 9/19* (2006.01)

(52) U.S. Cl.
CPC ........ *H03H 9/0547* (2013.01); *H03H 9/0533* (2013.01); *H03H 9/1021* (2013.01); *H03H 9/19* (2013.01)

(58) Field of Classification Search
None
See application file for complete search history.

(56) References Cited

U.S. PATENT DOCUMENTS 6,417,574 B1 * 7/2002 Misawa ................. H03H 9/725 257/737
8,576,020 B2 * 11/2013 Asamura ............... H01L 23/552 331/116 R
10,418,294 B1 * 9/2019 Clemente .......... H01L 23/49575
10,892,712 B2 * 1/2021 Jackson ................. H03B 5/326
2002/0057141 A1 * 5/2002 Nishizawa ........... H03H 9/0061 333/195
2006/0097029 A1 * 5/2006 Kainuma ............... B23K 20/10 228/110.1
2007/0080757 A1 4/2007 Yahata et al.
2007/0228892 A1 * 10/2007 Koyama ................. H01L 24/73 310/348
2007/0278903 A1 * 12/2007 Yamamoto ........... H03H 9/1021 310/348

(Continued)

FOREIGN PATENT DOCUMENTS

CN 1949663 A 4/2007
CN 102801103 A * 11/2012

(Continued)

*Primary Examiner* — William J Klimowicz
(74) *Attorney, Agent, or Firm* — Rankin, Hill & Clark LLP

(57) ABSTRACT

A vibrator device includes a base, a semiconductor element, and a vibrator. The semiconductor element is flip-chip mounted on the base, the vibrator is mounted on the semiconductor element via an adhesive, a first coupling wire is formed on the base, the semiconductor element and the first coupling wire are electrically coupled via a first bump, the first coupling wire and the vibrator are electrically coupled via a first wire, and the semiconductor element and the vibrator are covered by a mold portion placed on the base.

4 Claims, 8 Drawing Sheets

(56) References Cited

U.S. PATENT DOCUMENTS

2008/0284282 A1* 11/2008 Fujimoto ............. H03H 9/0595 310/317
2010/0207697 A1* 8/2010 Sayama ............. H03H 9/02094 29/25.35
2015/0162521 A1* 6/2015 Kojo ...................... H03H 9/171 310/344
2019/0341885 A1* 11/2019 Jackson .................. H01L 24/48
2020/0212881 A1* 7/2020 Bahr .................... H03H 9/1007
2021/0126585 A1* 4/2021 Jackson .................. H01L 24/11
2021/0273628 A1 9/2021 Takeuchi et al.
2021/0297062 A1 9/2021 Mizuguchi
2023/0155567 A1* 5/2023 Isozaki .................... H03H 9/19 310/344
2024/0072727 A1* 2/2024 Kojo ........................ H03B 5/32

FOREIGN PATENT DOCUMENTS

CN 113328720 A 8/2021
CN 113411060 A 9/2021
JP 2006-67552 A 3/2006
JP 2007060319 A * 3/2007
KR 20190138104 A * 12/2019 ......... H01L 41/0805

* cited by examiner

FIG. 3

VIBRATOR DEVICE WITH SEMICONDUCTOR ELEMENT AND VIBRATOR

The present application is based on, and claims priority from JP Application Serial Number 2021-187670, filed Nov. 18, 2021, the disclosure of which is hereby incorporated by reference herein in its entirety.

BACKGROUND

1. Technical Field

The present disclosure relates to a vibrator device.

2. Related Art

In related art, as shown in JP-A-2006-67552, a piezoelectric oscillator (vibrator device) in which a piezoelectric vibrator and an IC chip as a circuit oscillating the piezoelectric vibrator are placed in upward and downward directions of a substrate and the substrate and the IC chip are electrically coupled by wire bonding is known. In the configuration, generally, bonding between the substrate and the IC chip is bonding using an adhesive.

Further, in the configuration, to secure bonding quality, the adhesive is generally applied to a position overlapping with a pad provided on the IC chip in a plan view. As shown in JP-A-2006-67552, the pad provided on the IC chip is provided in an end portion of an upper surface of the IC chip. That is, the adhesive is applied to an end portion on a lower surface of the IC chip.

In the piezoelectric oscillator disclosed in JP-A-2006-67552, the adhesive may run over from the end portion of the IC chip bonded to the substrate. When the distance between the end portion of the IC chip and the pad provided on the substrate is short, the pad provided on the substrate is contaminated by the run-over adhesive. When the pad is contaminated, it is hard to bond a wire to the pad. Accordingly, it is necessary to set the distance between the end portion of the IC chip bonded to the substrate and the pad provided on the substrate to be sufficiently long. However, there is a problem that, when the distance between the end portion of the IC chip and the pad is set to be longer, further downsizing of the piezoelectric oscillator is harder.

SUMMARY

A vibrator device is a vibrator device including a base, a semiconductor element flip-chip mounted on the base, a vibrator mounted on the semiconductor element via an adhesive, a first coupling wire formed on the base, a first bump electrically coupling the semiconductor element and the first coupling wire, a first wire electrically coupling the first coupling wire and the vibrator, and a mold portion placed on the base and covering the semiconductor element and the vibrator.

A vibrator device is a vibrator device including a base, a semiconductor element flip-chip mounted on the base, a vibrator mounted on the semiconductor element via an adhesive, a first bump electrically coupling the semiconductor element and the base, a first wire electrically coupling the base and the vibrator, and a mold portion placed on the base and covering the semiconductor element and the vibrator.

BRIEF DESCRIPTION OF THE DRAWINGS

FIG. 3 is a plan view of a base according to embodiment 1.

DESCRIPTION OF EXEMPLARY EMBODIMENTS

Figure 1:
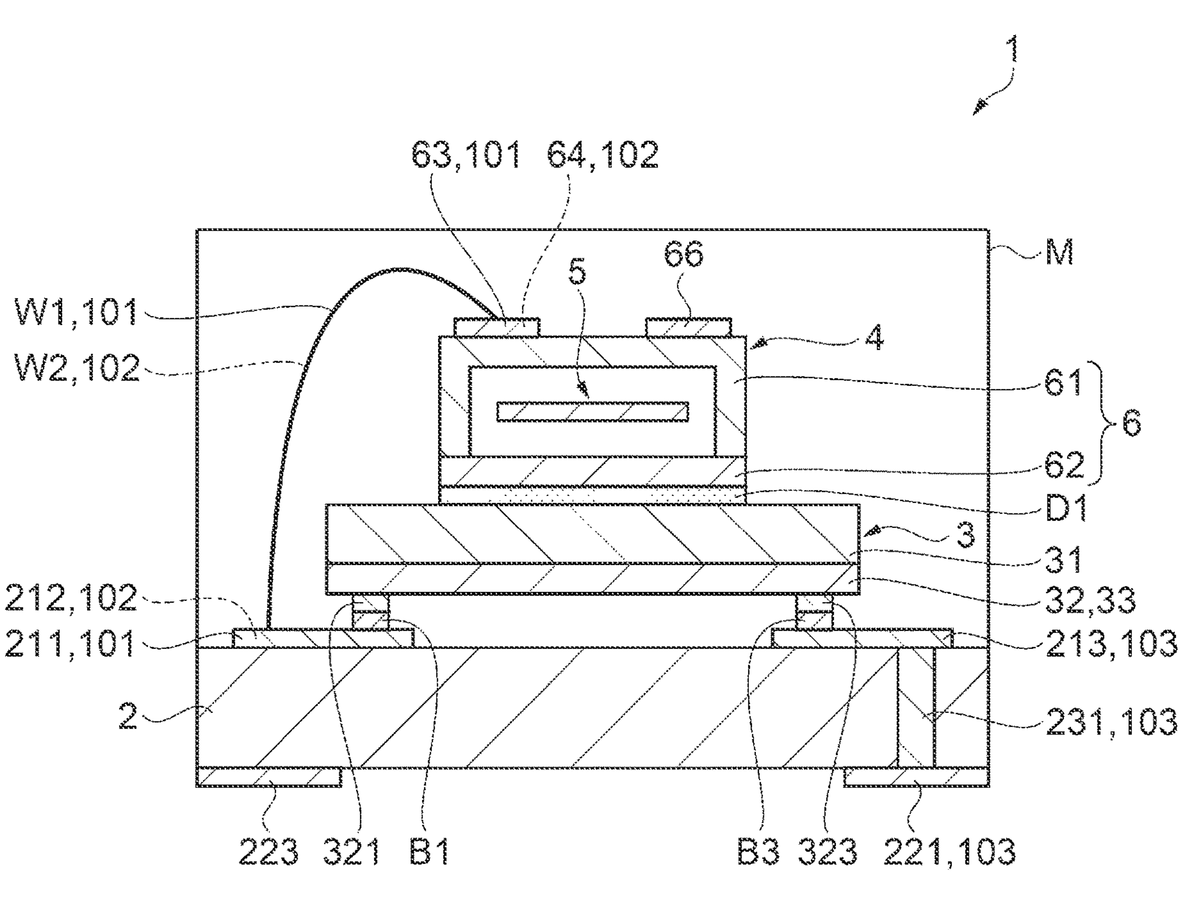
FIG. 1 is a sectional view of a vibrator device according to embodiment 1.
Figure 1:
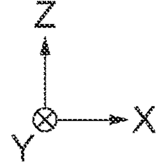

Next, referring to the drawings, embodiments of the present disclosure will be explained.

For convenience of explanation, the following respective drawings show an X-axis, a Y-axis, and a Z-axis as three axes orthogonal to one another. Directions along the X-axis are referred to as "X directions", directions along the Y-axis are referred to as "Y directions", and directions along the Z-axis are referred to as "Z directions". Further, head sides of arrows in the respective axial directions are referred to as "plus sides" and tail sides of the arrows are referred to as "minus sides". For example, the Y directions refer to both directions toward the plus side in the Y direction and the minus side in the Y direction. Furthermore, the plus side in the Z direction is also referred to as "upper" and the minus side in the Z direction is also referred to as "lower". A plan view from the Z direction is also simply referred to as "plan view".

1. Embodiment 1

A vibrator device 1 according to embodiment 1 will be explained with reference to FIGS. 1 to 5. In the embodiment, the vibrator device 1 is an oscillator. Note that the vibrator device 1 is not necessarily the oscillator. For example, the vibrator device 1 may be an inertial sensor.

First, a schematic configuration of the vibrator device 1 will be explained, and then, respective units including a base 2, a semiconductor element 3, and a vibrator 4 of the vibrator device 1 will be explained.

The schematic configuration of the vibrator device 1 is explained.

Figure 2:
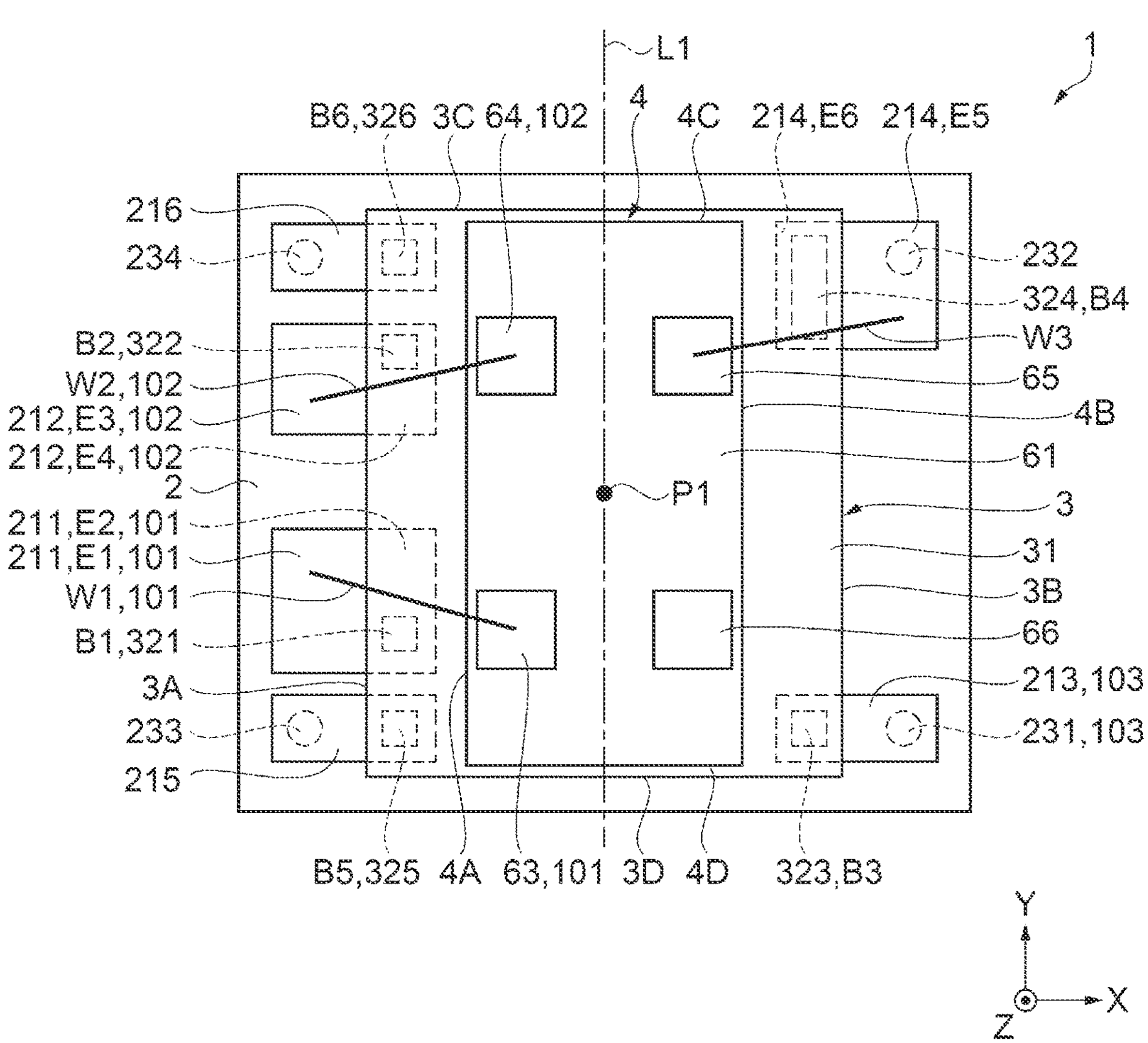
FIG. 2 is a plan view of the vibrator device according to embodiment 1.

As shown in FIGS. 1 and 2, the vibrator device 1 has the base 2, the semiconductor element 3, and the vibrator 4. The base 2, the semiconductor element 3, and the vibrator 4 are sequentially stacked along the Z directions as upward and downward directions. In the embodiment, the semiconductor element 3 is placed on an upper surface of the base 2 and the vibrator 4 is placed on an upper surface of the semiconductor element 3. The semiconductor element 3 and the vibrator 4 are covered by a mold portion M placed on the base 2. Note that, in FIG. 2, the mold portion M is omitted for convenience of explanation.

Further, the vibrator device 1 has a first drive wire 101, a second drive wire 102, and an external output wire 103. The first drive wire 101 and the second drive wire 102 are a pair of drive wires for applying drive signals output from the semiconductor element 3 to the vibrator 4 and oscillating the vibrator 4. The external output wire 103 is an output wire for outputting a reference signal such as a clock signal output from the semiconductor element 3 to the outside of the vibrator device 1.

A plurality of coupling wires are formed on the base 2. Specifically, on the upper surface of the base 2, a first coupling wire 211, a second coupling wire 212, a third coupling wire 213, a fourth coupling wire 214, a fifth coupling wire 215, and a sixth coupling wire 216 are formed as the plurality of coupling wires.

The semiconductor element 3 is flip-chip mounted on the upper surface of the base 2.

That is, a plurality of coupling terminals are formed on the lower surface of the semiconductor element 3. Further, the plurality of coupling terminals formed on the lower surface of the semiconductor element 3 and the plurality of coupling wires formed on the upper surface of the base 2 are electrically and mechanically coupled via bumps.

Specifically, on the lower surface of the semiconductor element 3, a first coupling terminal 321, a second coupling terminal 322, a third coupling terminal 323, a fourth coupling terminal 324, a fifth coupling terminal 325, and a sixth coupling terminal 326 are formed. Further, the first coupling terminal 321 and the first coupling wire 211 are electrically and mechanically coupled via a first bump B1. Similarly, the second coupling terminal 322, the third coupling terminal 323, the fourth coupling terminal 324, the fifth coupling terminal 325, and the sixth coupling terminal 326 and the second coupling wire 212, the third coupling wire 213, the fourth coupling wire 214, the fifth coupling wire 215, and the sixth coupling wire 216 are electrically and mechanically coupled via a second bump B2, a third bump B3, a fourth bump B4, a fifth bump B5, and a sixth bump B6, respectively.

The first bump B1, the second bump B2, the third bump B3, the fourth bump B4, the fifth bump B5, and the sixth bump B6 are not particularly limited as long as the bumps have conductivity and bondability. For example, metal bumps such as gold bumps, silver bumps, copper bumps, or solder bumps may be used.

The vibrator 4 is mounted on an upper surface of the semiconductor element 3 via an adhesive D1.

A plurality of electrode terminals are formed on an upper surface of the vibrator 4. Specifically, on the upper surface of the vibrator 4, a first electrode terminal 63, a second electrode terminal 64, a third electrode terminal 65, and a fourth electrode terminal 66 are formed.

The base 2 and the vibrator 4 are electrically coupled by wire bonding. Specifically, the first coupling wire 211 formed on the upper surface of the base 2 and the first electrode terminal 63 formed on the upper surface of the vibrator 4 are electrically coupled via a conductive first wire W1. Similarly, the second coupling wire 212 and fourth coupling wire 214 and the second electrode terminal 64 and third electrode terminal 65 are electrically coupled via conductive second wire W2 and third wire W3, respectively. The first wire W1, the second wire W2, and the third wire W3 are not particularly limited as long as the wires have conductivity and bondability. For example, gold wires, copper wires, aluminum wires, or the like may be used.

Here, the first coupling wire 211, the second coupling wire 212, and the fourth coupling wire 214 coupled to the first wire W1, the second wire W2, and the third wire W3, respectively, will be explained.

First, the first coupling wire 211 will be explained.

The first coupling wire 211 has a first coupling electrode E1 bonded to the first wire W1 and a second coupling electrode E2 bonded to the first coupling terminal 321 of the semiconductor element 3 via the first bump B1. In the embodiment, the first coupling electrode E1 is a part of the first coupling wire 211 not overlapping with the semiconductor element 3 in the plan view. The second coupling electrode E2 is a part of the first coupling wire 211 overlapping with the semiconductor element 3 in the plan view. In the embodiment, the first coupling electrode E1 and the second coupling electrode E2 are adjacently placed. The boundary between the first coupling electrode E1 and the second coupling electrode E2 overlaps with an end portion of the semiconductor element 3 in the plan view.

Note that "adjacently" in the present disclosure means "next to each other".

In a case where the base 2 and the semiconductor element 3 are bonded via an adhesive as in related art, deformation of the adhesive when the base 2 and the semiconductor element 3 are bonded is large and the adhesive may run over from the end portion of the semiconductor element 3. On the other hand, in the embodiment, deformation of the first bump B1 when the base 2 and the semiconductor element 3 are bonded is smaller than that of the adhesive. Accordingly, running over of the first bump B1 from the end portion of the semiconductor element 3 may be suppressed. Therefore, the first coupling electrode E1 bonded to the first wire W1 may be placed near the end portion of the semiconductor element 3. For example, the first coupling electrode E1 may be placed adjacent to the end portion of the semiconductor element 3 in the plan view like the embodiment.

As described above, the distance between the end portion of the semiconductor element 3 bonded to the base 2 and the first coupling electrode E1 provided on the base 2 may be made shorter, and further downsizing of the vibrator device 1 may be realized.

Next, the second coupling wire 212 will be explained.

The second coupling wire 212 has a third coupling electrode E3 bonded to the second wire W2 and a fourth coupling electrode E4 bonded to the second coupling terminal 322 of the semiconductor element 3 via the second bump B2. In the embodiment, the third coupling electrode E3 is a part of the second coupling wire 212 not overlapping with the semiconductor element 3 in the plan view. The fourth coupling electrode E4 is a part of the second coupling wire 212 overlapping with the semiconductor element 3 in the plan view. In the embodiment, the third coupling electrode E3 and the fourth coupling electrode E4 are adjacently placed. The boundary between the third coupling electrode E3 and the fourth coupling electrode E4 overlaps with an end portion of the semiconductor element 3 in the plan view.

Deformation of the second bump B2 when the base 2 and the semiconductor element 3 are bonded is smaller than that of the adhesive, and the third coupling electrode E3 bonded to the second wire W2 may be placed near the end portion of the semiconductor element 3. For example, the third coupling electrode E3 may be placed adjacent to the end portion of the semiconductor element 3 in the plan view like the embodiment.

Next, the fourth coupling wire 214 will be explained.

The fourth coupling wire 214 has a fifth coupling electrode E5 bonded to the third wire W3 and a sixth coupling electrode E6 bonded to the fourth coupling terminal 324 of the semiconductor element 3 via the fourth bump B4. In the embodiment, the fifth coupling electrode E5 is a part of the fourth coupling wire 214 not overlapping with the semiconductor element 3 in the plan view. The sixth coupling electrode E6 is a part of the fourth coupling wire 214 overlapping with the semiconductor element 3 in the plan view. In the embodiment, the fifth coupling electrode E5 and the sixth coupling electrode E6 are adjacently placed. The boundary between the fifth coupling electrode E5 and the sixth coupling electrode E6 overlaps with an end portion of the semiconductor element 3 in the plan view.

Deformation of the fourth bump B4 when the base 2 and the semiconductor element 3 are bonded is smaller than that of the adhesive, and the fifth coupling electrode E5 may be placed near the end portion of the semiconductor element 3. For example, the fifth coupling electrode E5 may be placed adjacent to the end portion of the semiconductor element 3 in the plan view like the embodiment.

As described above, in the embodiment, the third coupling electrode E3 of the second coupling wire 212 and the fifth coupling electrode E5 of the fourth coupling wire 214 may be placed near the end portions of the semiconductor element 3 like the first coupling electrode E1 of the first coupling wire 211. Therefore, as long as the effect that further downsizing of the vibrator device 1 may be realized is exerted, the second coupling wire 212, the third coupling electrode E3, the fourth coupling electrode E4, the second bump B2, and the second wire W2 may be read as the first coupling wire 211, the first coupling electrode E1, the second coupling electrode E2, the first bump B1, and the first wire W1, respectively. Similarly, the fourth coupling wire 214, the fifth coupling electrode E5, the sixth coupling electrode E6, the fourth bump B4, and the third wire W3 may be read as the first coupling wire 211, the first coupling electrode E1, the second coupling electrode E2, the first bump B1, and the first wire W1, respectively.

As above, the schematic configuration of the vibrator device 1 will be explained.

Next, the respective units of the base 2, the semiconductor element 3, and the vibrator 4 of the vibrator device 1 will be explained.

First, the base 2 will be explained.

Figure 3:
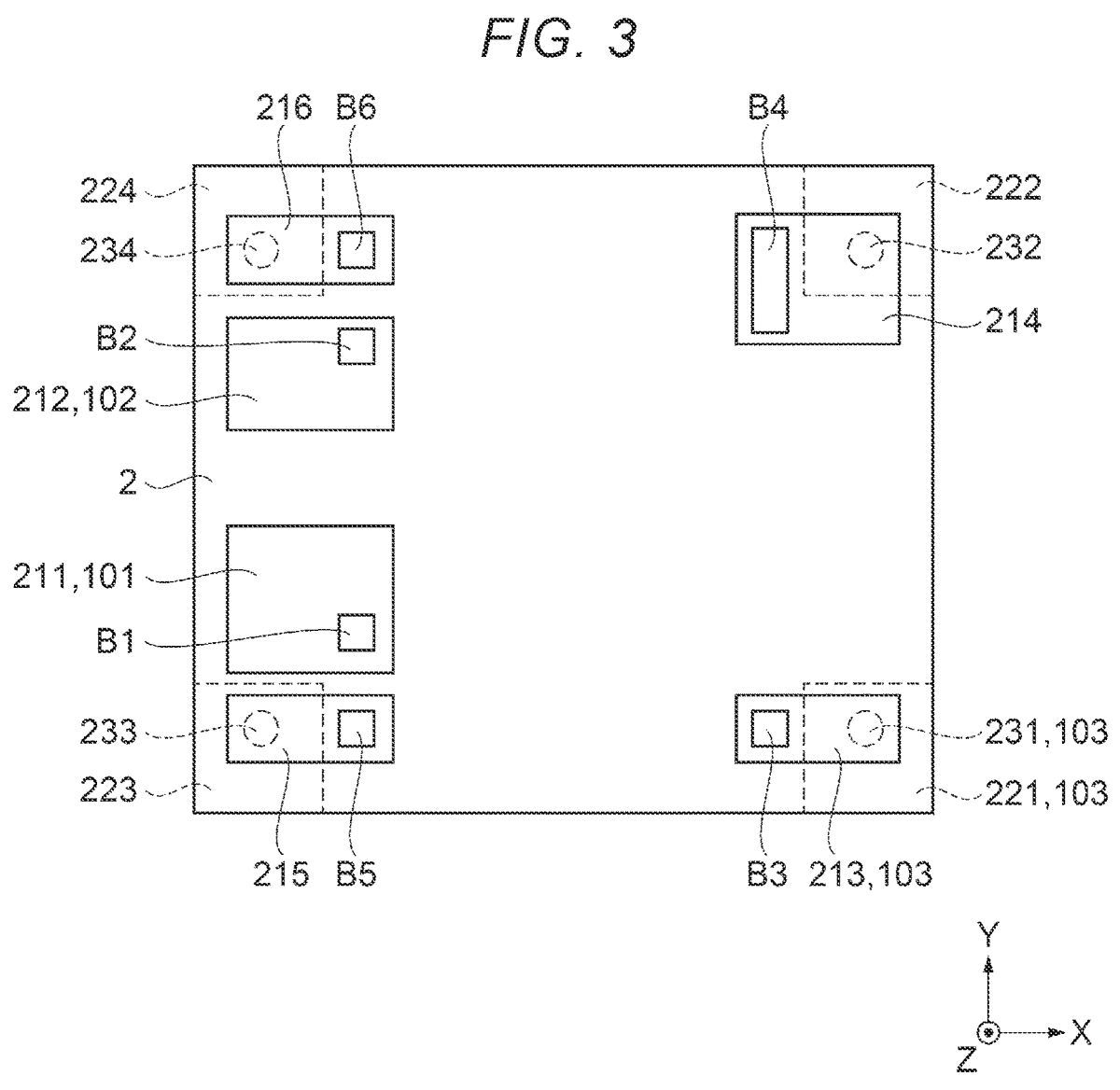

As shown in FIGS. 2 and 3, in the embodiment, the base 2 is in a plate shape formed to have a substantially rectangular planar shape. The base 2 has the upper surface as a surface facing the semiconductor element 3 in the base 2 and the lower surface having a front-back relation to the upper surface of the base 2. The material forming the base 2 is not particularly limited. For example, a ceramic substrate or the like may be used as the base 2.

Note that "substantially rectangular shape" in the present disclosure includes e.g. a square, an oblong, a parallelogram, a trapezoid, and other quadrangles and further includes shapes that may be regarded as being equal to quadrangles in addition to the shapes conforming with the quadrangles. The shapes that may be regarded as being equal to quadrangles include e.g. a shape having at least one corner portion convexly or concavely curved, a shape having at least one corner portion cut off, and a shape having an entire or a part of at least one side curved or bent in a quadrangle.

As shown in FIGS. 1 and 3, on the lower surface of the base 2, a first external terminal 221, a second external terminal 222, a third external terminal 223, and a fourth external terminal 224 are formed. The first external terminal 221, the second external terminal 222, the third external terminal 223, and the fourth external terminal 224 are external terminals for electrically coupling the vibrator device 1 to the outside.

The first external terminal 221 is an external output terminal for outputting a reference signal such as a clock signal. The second external terminal 222 is a ground terminal for coupling to a ground potential. The ground potential in the present disclosure refers to a reference potential having a fixed potential. The third external terminal 223 is a power supply terminal for coupling to a power supply. The fourth external terminal 224 is an output enable terminal for controlling the output from the first external terminal 221.

Note that, in the embodiment, the four external terminals of the first external terminal 221, the second external terminal 222, the third external terminal 223, and the fourth external terminal 224 are formed, however, the number of the external terminals is not particularly limited. The number of external terminals may be appropriately set according to the configuration of the vibrator device 1.

The first external terminal 221 is placed in a corner at the plus side in the X direction and the minus side in the Y direction. The second external terminal 222 is placed in a corner at the plus side in the X direction and the plus side in the Y direction. The third external terminal 223 is placed in a corner at the minus side in the X direction and the minus side in the Y direction. The fourth external terminal 224 is placed in a corner at the minus side in the X direction and the plus side in the Y direction.

Note that, in the embodiment, the first external terminal 221, the second external terminal 222, the third external terminal 223, and the fourth external terminal 224 are placed as described above, however, the placement of the external terminals is not particularly limited, but may be appropriately set according to the configuration of the vibrator device 1.

Further, in the base 2, a plurality of vias 231, 232, 233, 234 penetrating between the upper surface and the lower surface of the base 2 are provided. The vias 231, 232, 233, 234 are respectively through electrodes formed by filling of through holes penetrating the base 2 with conductors. The via 231, the via 232, the via 233, and the via 234 are placed to overlap with the first external terminal 221, the second external terminal 222, the third external terminal 223, and the fourth external terminal 224 in the plan view, respectively.

As shown in FIGS. 2 and 3, on the upper surface of the base 2, the first coupling wire 211, the second coupling wire 212, the third coupling wire 213, the fourth coupling wire 214, the fifth coupling wire 215, and the sixth coupling wire 216 respectively electrically coupled to the semiconductor element 3 are formed.

As described above, the first coupling wire 211 is electrically coupled to the first coupling terminal 321 of the semiconductor element 3 via the first bump B1 and electrically coupled to the first electrode terminal 63 of the vibrator 4 via the first wire W1.

As described above, the second coupling wire 212 is electrically coupled to the second coupling terminal 322 of the semiconductor element 3 via the second bump B2 and electrically coupled to the second electrode terminal 64 of the vibrator 4 via the second wire W2.

As described above, the third coupling wire 213 is electrically coupled to the third coupling terminal 323 of the semiconductor element 3 via the third bump B3.

Further, the third coupling wire 213 is placed to overlap with the via 231 in the plan view. The third coupling wire 213 is electrically coupled to the first external terminal 221 as the external output terminal via the via 231.

As described above, the fourth coupling wire 214 is electrically coupled to the fourth coupling terminal 324 of the semiconductor element 3 via the fourth bump B4 and electrically coupled to the third electrode terminal 65 of the vibrator 4 via the third wire W3.

Further, the fourth coupling wire 214 is placed to overlap with the via 232 in the plan view. The fourth coupling wire 214 is electrically coupled to the second external terminal 222 via the via 232.

As described above, the fifth coupling wire 215 and the sixth coupling wire 216 are electrically coupled to the fifth coupling terminal 325 and the sixth coupling terminal 326 of the semiconductor element 3 via the fifth bump B5 and the sixth bump B6, respectively.

Further, the fifth coupling wire 215 and the sixth coupling wire 216 are placed to overlap with the vias 233, 234 in the plan view, respectively. The fifth coupling wire 215 and the sixth coupling wire 216 are electrically coupled to the third external terminal 223 and the fourth external terminal 224 via the vias 233, 234, respectively.

Next, the semiconductor element 3 will be explained.

As shown in FIG. 1, the semiconductor element 3 has a semiconductor substrate 31 and a circuit unit 32. In the embodiment, the circuit unit 32 is placed on a lower surface of the semiconductor substrate 31. That is, the upper surface of the semiconductor element 3 is an upper surface of the semiconductor substrate 31 and the lower surface of the semiconductor element 3 is a lower surface of the circuit unit 32.

Further, as shown in FIG. 2, in the embodiment, the semiconductor element 3 has the substantially rectangular planar shape. The semiconductor element 3 has a first side 3A, a second side 3B, a third side 3C, and a fourth side 3D in the plan view. The first side 3A of the semiconductor element 3 is a side defining an end portion at the minus side in the X direction of the semiconductor element 3. The second side 3B of the semiconductor element 3 is a side facing the first side 3A and defining an end portion at the plus side in the X direction of the semiconductor element 3. The third side 3C and the fourth side 3D of the semiconductor element 3 are sides respectively coupling the first side 3A and the second side 3B. The third side 3C is the side defining an end portion at the plus side in the Y direction of the semiconductor element 3. The fourth side 3D is the side facing the third side 3C and defining an end portion at the minus side in the Y direction of the semiconductor element 3.

The semiconductor substrate 31 is in a plate shape formed to have a substantially rectangular planar shape. The material forming the semiconductor substrate 31 is not particularly limited. For example, silicon, germanium, silicon germanium, or the like may be used as the semiconductor substrate 31.

The circuit unit 32 is an integrated circuit in which active elements including a plurality of transistors (not shown) are electrically coupled by wires (not shown). The circuit unit 32 has an oscillation circuit 33 generating the frequency of the reference signal such as a clock signal by oscillating a vibrator element 5 of the vibrator 4. Note that the circuit unit 32 may have a temperature compensated circuit correcting the vibration characteristics of the vibrator element 5 according to temperature changes, a processing circuit processing an output signal from the oscillation circuit 33, an electrostatic protection circuit, or the like in addition to the oscillation circuit 33.

As shown in FIGS. 1 and 2, on the lower surface of the semiconductor element 3, the first coupling terminal 321, the second coupling terminal 322, the third coupling terminal 323, the fourth coupling terminal 324, the fifth coupling terminal 325, and the sixth coupling terminal 326 are formed. The first coupling terminal 321, the second coupling terminal 322, the third coupling terminal 323, the fourth coupling terminal 324, the fifth coupling terminal 325, and the sixth coupling terminal 326 are electrically coupled to the circuit unit 32.

The first coupling terminal 321 and the second coupling terminal 322 are drive signal output terminals for outputting drive signals that oscillate the vibrator 4. The vibrator 4 oscillates according to the drive signals output from the first coupling terminal 321 and the second coupling terminal 322. The third coupling terminal 323 is a reference signal output terminal for outputting the reference signal such as a clock signal. The fourth coupling terminal 324 is a ground terminal for coupling to a ground potential. The fifth coupling terminal 325 is a power supply terminal for coupling to a power supply. The sixth coupling terminal 326 is an output enable terminal for controlling the output from the third coupling terminal 323 as the reference signal output terminal.

Note that, in the embodiment, the six coupling terminals of the first coupling terminal 321, the second coupling terminal 322, the third coupling terminal 323, the fourth coupling terminal 324, the fifth coupling terminal 325, and the sixth coupling terminal 326 are formed, however, the number of the coupling terminals formed on the semiconductor element 3 is not particularly limited. The number of coupling terminals may be appropriately set according to the configuration of the semiconductor element 3.

Further, the first bump B1, the second bump B2, the third bump B3, the fourth bump B4, the fifth bump B5, and the sixth bump B6 are placed between the base 2 and the semiconductor element 3.

The first bump B1 is placed to overlap with the first coupling wire 211 formed on the upper surface of the base 2 and the first coupling terminal 321 placed on the lower surface of the semiconductor element 3 in the plan view. In this manner, the first coupling terminal 321 and the first coupling wire 211 are electrically and mechanically coupled via the first bump B1.

Similarly, the second coupling terminal 322, the third coupling terminal 323, the fourth coupling terminal 324, the fifth coupling terminal 325, and the sixth coupling terminal 326 and the second coupling wire 212, the third coupling wire 213, the fourth coupling wire 214, the fifth coupling wire 215, and the sixth coupling wire 216 are electrically and mechanically coupled via the second bump B2, the third bump B3, the fourth bump B4, the fifth bump B5, and the sixth bump B6, respectively. Note that the first bump B1, the second bump B2, the third bump B3, the fourth bump B4, the fifth bump B5, and the sixth bump B6 may be provided on any one of the base 2 and the semiconductor element 3.

The vibrator 4 is placed on the upper surface of the semiconductor element 3. The semiconductor element 3 and the vibrator 4 are bonded via an adhesive D1.

Next, the vibrator 4 will be explained.

Figure 4:
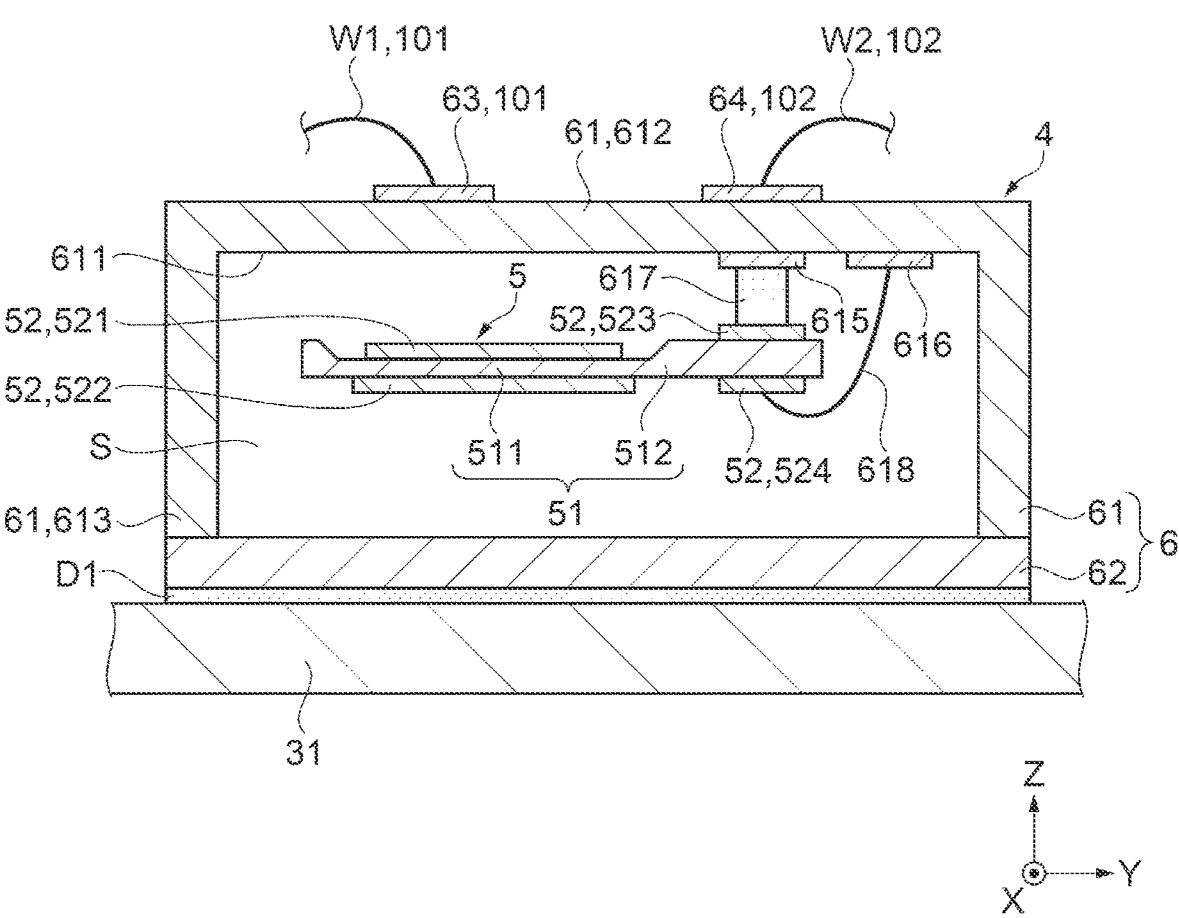
FIG. 4 is a sectional view of a vibrator according to embodiment 1.

As shown in FIGS. 1 and 4, the vibrator 4 has the vibrator element 5 and a package 6 housing the vibrator element 5.

Further, as shown in FIG. 2, in the embodiment, the vibrator 4 is formed to have a substantially rectangular planar shape. The vibrator 4 has a first side 4A, a second side 4B, a third side 4C, and a fourth side 4D in the plan view. The first side 4A of the vibrator 4 is a side defining an end portion at the minus side in the X direction of the vibrator 4. The second side 4B of the vibrator 4 is a side facing the first side 4A and defining an end portion at the plus side in the X direction of the vibrator 4. The third side 4C and the fourth side 4D of the vibrator 4 are sides respectively coupling the first side 4A and the second side 4B. The third side 4C is a side defining an end portion at the plus side in the Y direction of the vibrator 4. The fourth side 4D is a side facing the third side 4C and defining an end portion at the minus side in the Y direction of the vibrator 4.

First, the vibrator element 5 will be explained.

Figure 5:
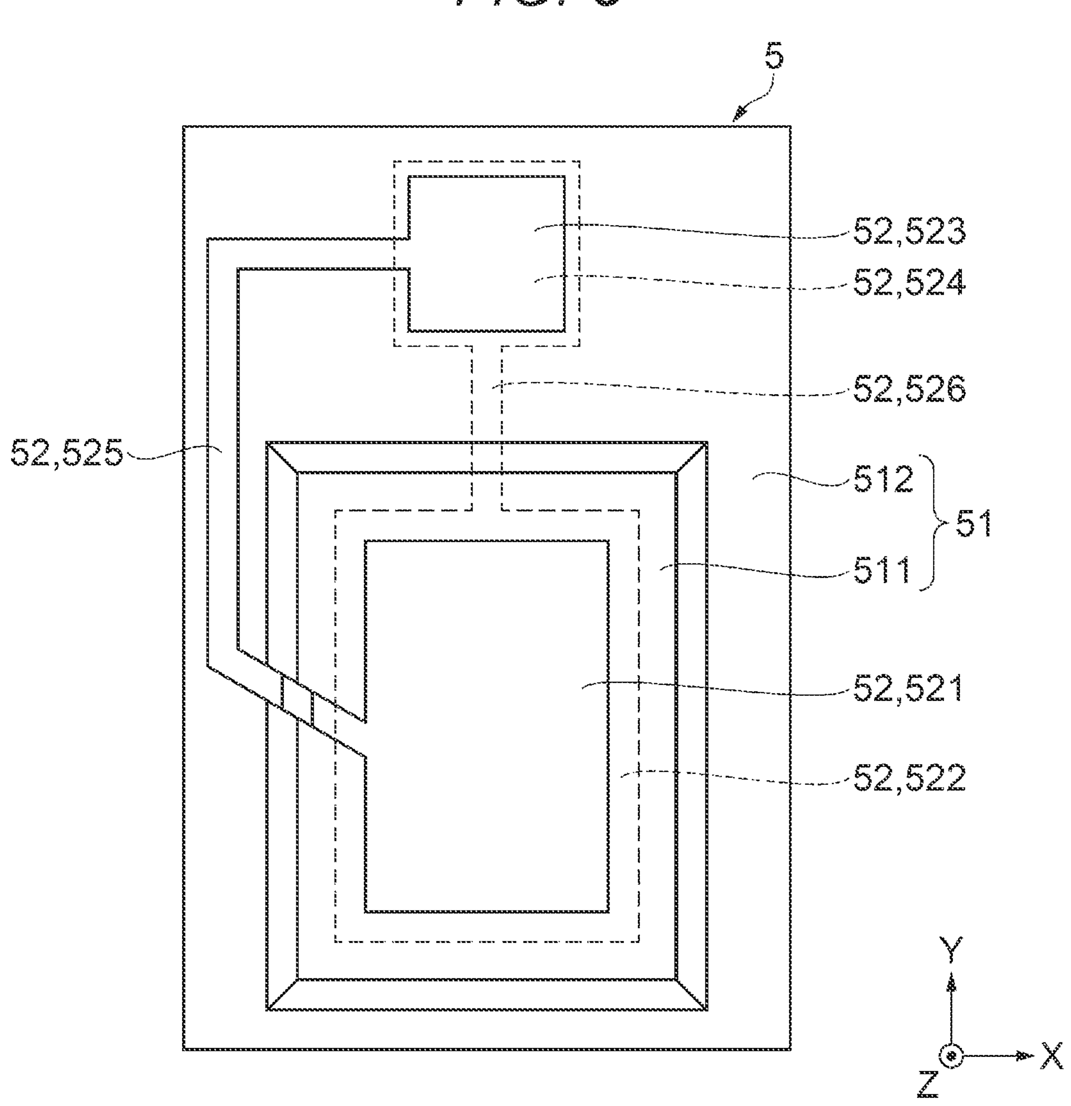
FIG. 5 is a plan view of a vibrator element according to embodiment 1.

As shown in FIGS. 4 and 5, the vibrator element 5 has a vibrator substrate 51 and electrodes 52 placed on surfaces of the vibrator substrate 51.

The vibrator substrate 51 is in a plate shape. The vibrator substrate 51 has a thin vibrating portion 511 and a thick portion 512 located around the vibrating portion 511 and having a larger thickness than the vibrating portion 511. In the embodiment, the vibrator substrate 51 is an AT cut quartz crystal substrate.

The electrodes 52 have a first excitation electrode 521 and a second excitation electrode 522 as a pair of excitation electrodes, a pair of pad electrodes 523, 524, and a pair of lead wires 525, 526. The first excitation electrode 521 is placed on an upper surface of the vibrating portion 511. The second excitation electrode 522 is placed on a lower surface of the vibrating portion 511. The first excitation electrode 521 and the second excitation electrode 522 are placed in positions facing via the vibrator substrate 51. The pad electrode 523 is placed on an upper surface of the thick portion 512. The pad electrode 524 is placed on a lower surface of the thick portion 512. The pad electrode 523 and the pad electrode 524 are placed in positions facing via the vibrator substrate 51. The lead wire 525 is placed on the upper surface of the thick portion 512 and electrically couples the first excitation electrode 521 and the pad electrode 523. The lead wire 526 is placed on the lower surface of the thick portion 512 and electrically couples the second excitation electrode 522 and the pad electrode 524.

Drive signals are applied to the first excitation electrode 521 and the second excitation electrode 522 via the pad electrodes 523, 524 and the lead wires 525, 526, and thereby, a thickness-shear vibration may be excited in the vibrating portion 511 sandwiched between the first excitation electrode 521 and the second excitation electrode 522.

As above, the vibrator element 5 is briefly explained.

Note that the configuration of the vibrator element 5 is not limited to the above described configuration. For example, the vibrator element 5 is not limited to a vibrator element in a plate shape that produces a thickness-shear vibration. For example, a vibrator element having a plurality of vibrating arms flexurally vibrating in in-plane directions or a vibrator element having a plurality of vibrating arms flexurally vibrating in out-of-plane directions may be employed. Further, for example, a vibrator element using an X cut quartz crystal substrate, a Y cut quartz crystal substrate, a Z cut quartz crystal substrate, a BT cut quartz crystal substrate, an SC cut quartz crystal substrate, an ST cut quartz crystal substrate, or the like as the vibrator substrate 51 may be employed. Alternatively, for example, a vibrator element using another piezoelectric material than the quartz crystal may be employed. Alternatively, for example, a SAW (Surface Acoustic Wave) resonator or an MEMS (Micro Electro Mechanical Systems) vibrator in which a piezoelectric element is placed on a semiconductor substrate of silicon or the like may be employed.

Next, the package 6 housing the vibrator element 5 will be explained.

As shown in FIG. 4, the package 6 has a base member 61 and a lid 62 as a lid member. In the embodiment, the lid 62 is placed on a lower surface of the base member 61. That is, the upper surface of the vibrator 4 is an upper surface of the base member 61 and the lower surface of the vibrator 4 is a lower surface of the lid 62.

The base member 61 is in a box shape having a recessed portion 611. In the embodiment, the base member 61 is formed to have a substantially rectangular planar shape. The recessed portion 611 has an opening part at the lower surface side of the base member 61. In other words, the base member 61 has a base portion 612 in a plate shape and a side wall portion 613 in a frame shape stood downward from the outer peripheral part of the base portion 612.

The lid 62 is in a plate shape. The lid 62 is bonded to the lower surface of the base member 61 to close the opening part of the recessed portion 611. The recessed portion 611 is closed by the lid 62, and thereby, a housing space S is formed. The vibrator element 5 is housed in the housing space S. For example, the housing space S is depressurized.

Materials forming the base member 61 and the lid 62 are not particularly limited. As the base member 61 and the lid 62, e.g. ceramics substrates of aluminum oxide, glass substrates, semiconductor substrates of silicon, or the like may be used. Note that, when the base member 61 is a ceramics substrate, an alloy such as kovar having a coefficient of linear expansion approximating the ceramics substrate may be used for the lid 62.

Further, internal electrodes 615, 616 are placed on a bottom surface of the recessed portion 611.

The vibrator element 5 is placed so that the upper surface of the vibrator substrate 51 may face the bottom surface of the recessed portion 611. The pad electrode 523 placed on the upper surface of the vibrator substrate 51 and the internal electrode 615 are bonded via a conductive adhesive 617. That is, by the conductive adhesive 617, the vibrator element 5 is fixed to the bottom surface of the recessed portion 611 and the pad electrode 523 and the internal electrode 615 are electrically coupled. The pad electrode 524 placed on the lower surface of the vibrator substrate 51 and the internal electrode 616 are electrically coupled via a wire 618 formed using a conductive wire.

As shown in FIGS. 2 and 4, on the upper surface of the base member 61, the first electrode terminal 63, the second electrode terminal 64, the third electrode terminal 65, and the fourth electrode terminal 66 are formed.

As shown in FIG. 4, the first electrode terminal 63 is electrically coupled to the internal electrode 615 via an internal wire (not shown) provided within the base member 61. That is, as shown in FIGS. 4 and 5, the first electrode terminal 63 is electrically coupled to the first excitation electrode 521 via the internal electrode 615, the pad electrode 523, and the lead wire 525.

Further, as shown in FIGS. 1 and 2, the first electrode terminal 63 and the first coupling wire 211 formed on the base 2 are electrically coupled via the first wire W1. That is, the first coupling wire 211 and the first excitation electrode 521 are electrically coupled via the first wire W1.

As shown in FIG. 4, the second electrode terminal 64 is electrically coupled to the internal electrode 616 via an internal wire (not shown) provided within the base member 61. That is, as shown in FIGS. 4 and 5, the second electrode terminal 64 is electrically coupled to the second excitation electrode 522 via the internal electrode 616, the pad electrode 524, and the lead wire 526.

Further, as shown in FIGS. 1 and 2, the second electrode terminal 64 and the second coupling wire 212 placed on the upper surface of the base 2 are electrically coupled via the second wire W2. That is, the second coupling wire 212 and the second excitation electrode 522 are electrically coupled via the second wire W2.

The third electrode terminal 65 is a ground terminal for coupling to the ground potential. The third electrode terminal 65 is electrically coupled to the respective units of the vibrator 4, e.g. the vibrator element 5 and the lid 62 via internal wires (not shown) provided within the base member 61. Further, the third electrode terminal 65 and the fourth coupling wire 214 placed on the upper surface of the base 2 are electrically coupled via the third wire W3. Note that the third electrode terminal 65 may be a dummy terminal not electrically coupled to the respective units of the vibrator 4. Alternatively, the third electrode terminal 65 may be omitted.

The fourth electrode terminal 66 is a dummy terminal not electrically coupled to the respective units of the vibrator 4. In the embodiment, the fourth electrode terminal 66 as the dummy terminal electrically floats, however, may be coupled to the ground potential like the third electrode terminal 65. Alternatively, the fourth electrode terminal 66 may be omitted.

Note that, in the embodiment, the four electrode terminals of the first electrode terminal 63, the second electrode terminal 64, the third electrode terminal 65, and the fourth electrode terminal 66 are formed, however, the number of the electrode terminals formed on the vibrator 4 is not particularly limited. The number of electrode terminals may be appropriately set according to the configuration of the vibrator 4.

Further, in the embodiment, the four electrode terminals of the first electrode terminal 63, the second electrode terminal 64, the third electrode terminal 65, and the fourth electrode terminal 66 are placed in a square lattice form, however, the placement of the electrode terminals formed on the vibrator 4 is not particularly limited. For example, the four electrode terminals of the first electrode terminal 63, the second electrode terminal 64, the third electrode terminal 65, and the fourth electrode terminal 66 may be placed in a triangular lattice form.

As above, the base 2, the semiconductor element 3, and the vibrator 4 are explained.

Here, returning to FIG. 2, the first coupling wire 211, the second coupling wire 212, and the fourth coupling wire 214 formed on the base 2 will be explained in detail.

First, the first coupling wire 211 will be explained.

As described above, the first coupling wire 211 has the first coupling electrode E1 bonded to the first wire W1 and the second coupling electrode E2 bonded to the first coupling terminal 321 of the semiconductor element 3 via the first bump B1. In the embodiment, the first coupling wire 211 is placed in a position overlapping with the first side 3A of the semiconductor element 3 in the plan view. The first side 3A of the semiconductor element 3 is the end portion at the minus side in the X direction in the semiconductor element 3 in the plan view. The first coupling electrode E1 is the part not overlapping with the semiconductor element 3 in the plan view and placed at the minus side in the X direction of the first side 3A. The second coupling electrode E2 is the part overlapping with the semiconductor element 3 in the plan view and placed at the plus side in the X direction of the first side 3A. In the embodiment, the first coupling electrode E1 is placed adjacent to the first side 3A of the semiconductor element 3 in the plan view. As described above, the distance between the end portion of the semiconductor element 3 bonded to the base 2 and the first coupling electrode E1 provided on the base 2 may be made shorter, and further downsizing of the vibrator device 1 may be realized.

Note that, in the embodiment, the first coupling electrode E1 and the second coupling electrode E2 are adjacent to each other with the first side 3A of the semiconductor element 3 as a boundary in the plan view, however, the first coupling electrode E1 and the second coupling electrode E2 are not necessarily adjacent to each other as long as the first coupling electrode E1 and the second coupling electrode E2 are electrically coupled. For example, the first coupling wire 211 may further have a wiring portion electrically coupling the first coupling electrode E1 and the second coupling electrode E2 in addition to the first coupling electrode E1 and the second coupling electrode E2. According to the configuration, the first coupling electrode E1 and the second coupling electrode E2 may be formed apart at a distance while being electrically coupled.

Next, the second coupling wire 212 will be explained.

As described above, the second coupling wire 212 has the third coupling electrode E3 bonded to the second wire W2 and the fourth coupling electrode E4 bonded to the second coupling terminal 322 of the semiconductor element 3 via the second bump B2. In the embodiment, the second coupling wire 212 is placed in a position overlapping with the first side 3A of the semiconductor element 3 in the plan view. The third coupling electrode E3 is the part not overlapping with the semiconductor element 3 in the plan view and placed at the minus side in the X direction of the first side 3A. The fourth coupling electrode E4 is the part overlapping with the semiconductor element 3 in the plan view and placed at the plus side in the X direction of the first side 3A. In the embodiment, the third coupling electrode E3 is placed adjacent to the first side 3A of the semiconductor element 3 in the plan view. As described above, the distance between the end portion of the semiconductor element 3 bonded to the base 2 and the third coupling electrode E3 provided on the base 2 may be made shorter, and further downsizing of the vibrator device 1 may be realized.

Note that, in the embodiment, the third coupling electrode E3 and the fourth coupling electrode E4 are adjacent to each other with the first side 3A of the semiconductor element 3 as a boundary in the plan view, however, the third coupling electrode E3 and the fourth coupling electrode E4 are not necessarily adjacent to each other as long as the third coupling electrode E3 and the fourth coupling electrode E4 are electrically coupled.

Next, the fourth coupling wire 214 is explained.

As described above, the fourth coupling wire 214 has the fifth coupling electrode E5 bonded to the third wire W3 and the sixth coupling electrode E6 bonded to the fourth coupling terminal 324 of the semiconductor element 3 via the fourth bump B4. In the embodiment, the fourth coupling wire 214 is placed in a position overlapping with the second side 3B of the semiconductor element 3 in the plan view. The second side 3B of the semiconductor element 3 is the end portion at the plus side in the X direction in the semiconductor element 3 in the plan view. The fifth coupling electrode E5 is the part not overlapping with the semiconductor element 3 in the plan view and placed at the plus side in the X direction of the second side 3B. The sixth coupling electrode E6 is the part overlapping with the semiconductor element 3 in the plan view and placed at the minus side in the X direction of the second side 3B. In the embodiment, the fifth coupling electrode E5 is placed adjacent to the second side 3B of the semiconductor element 3 in the plan view. As described above, the distance between the end portion of the semiconductor element 3 bonded to the base 2 and the fifth coupling electrode E5 provided on the base 2 may be made shorter, and further downsizing of the vibrator device 1 may be realized.

Note that, in the embodiment, the fifth coupling electrode E5 and the sixth coupling electrode E6 are adjacent to each other with the second side 3B of the semiconductor element 3 as a boundary in the plan view, however, the fifth coupling electrode E5 and the sixth coupling electrode E6 are not necessarily adjacent to each other as long as the fifth coupling electrode E5 and the sixth coupling electrode E6 are electrically coupled.

As above, the first coupling wire 211, the second coupling wire 212, and the fourth coupling wire 214 are explained.

Next, the first drive wire 101, the second drive wire 102, and the external output wire 103 of the vibrator device 1 will be explained.

First, the first drive wire 101 and the second drive wire 102 are explained.

As shown in FIGS. 1 and 2, the first drive wire 101 and the second drive wire 102 are the pair of drive wires for applying drive signals output from the semiconductor element 3 to the vibrator 4 and oscillating the vibrator 4.

In the embodiment, the first drive wire 101 has the first electrode terminal 63 formed on the vibrator 4, the first coupling wire 211 formed on the base 2, and the first wire W1 electrically coupling the first electrode terminal 63 and the first coupling wire 211. The second drive wire 102 has the second electrode terminal 64 formed on the vibrator 4, the second coupling wire 212 formed on the base 2, and the second wire W2 electrically coupling the second electrode terminal 64 and the second coupling As described above, the first coupling terminal 321 and second coupling terminal 322 formed on the semiconductor element 3 and the first coupling wire 211 and second coupling wire 212 are electrically coupled, respectively. Further, the first electrode terminal 63 and second electrode terminal 64 formed on the vibrator 4 and the first excitation electrode 521 and second excitation electrode 522 are electrically coupled, respectively.

Accordingly, the drive signals output from the first coupling terminal 321 and second coupling terminal 322 formed on the semiconductor element 3 are applied to the first excitation electrode 521 and second excitation electrode 522 of the vibrator 4 via the first drive wire 101 and second drive wire 102, and thereby, the vibrator 4 may be oscillated.

Next, the external output wire 103 is explained.

As shown in FIGS. 1 and 3, the external output wire 103 is the output wire for outputting the reference signal such as a clock signal output from the semiconductor element 3 to the outside of the vibrator device 1.

In the embodiment, the external output wire 103 has the third coupling wire 213, the first external terminal 221 as the external output terminal, and the via 231 electrically coupling the third coupling wire 213 and the first external terminal 221.

As described above, the third coupling terminal 323 formed on the semiconductor element 3 and the third coupling wire 213 formed on the base 2 are electrically coupled.

Accordingly, the reference signal output from the third coupling terminal 323 may be output to the outside of the vibrator device 1 via the external output wire 103.

Here, when the first drive wire 101 and second drive wire 102 and the external output wire 103 are close to each other, parasitic capacitances produced between the first drive wire 101 and second drive wire 102 and the external output wire 103 increase. With the increase of the parasitic capacitances, the difference between the parasitic capacitance between the first drive wire 101 and the external output wire 103 and the parasitic capacitance between the second drive wire 102 and the external output wire 103 increases. When the difference in parasitic capacitance increases, frequency-power characteristics of the vibrator device 1 are deteriorated. Note that the frequency-power characteristics refer to fluctuations of the output frequency relative to fluctuations of the power supply voltage, and the deterioration of the frequency-power characteristics means that the fluctuations of the output frequency relative to the fluctuations of the power supply voltage are larger.

That is, the parasitic capacitances produced between the first drive wire 101 and second drive wire 102 and the external output wire 103 are reduced, and thereby, the vibrator device 1 with good frequency-power characteristics may be provided.

As above, the first drive wire 101, the second drive wire 102, and the external output wire 103 are explained.

Returning to FIG. 2, the position relationship between the first coupling wire 211 and second coupling wire 212 formed on the base 2 and the third coupling wire 213 formed on the base 2 will be explained.

In the embodiment, the first coupling wire 211 and the second coupling wire 212 are placed side by side in the Y directions in the plan view.

The first coupling wire 211 and the second coupling wire 212 are placed at the minus side in the X direction of a center line L1 passing through a center point P1 of the vibrator 4 and extending along the Y directions in the plan view.

On the other hand, the third coupling wire 213 is placed at the plus side in the X direction of the center line L1 passing through the center point P1 of the vibrator 4 in the plan view.

In other words, in the plan view, the first coupling wire 211 and the second coupling wire 212 are placed at one side of the vibrator 4, i.e., the minus side in the X direction of the center line L1 passing through the center point P1 of the vibrator 4. Further, the third coupling wire 213 is placed at the other side of the vibrator 4, i.e., the plus side in the X direction of the center line L1 passing through the center point P1 of the vibrator 4.

As described above, in the plan view, the first coupling wire 211 and the second coupling wire 212 are placed at one side of the vibrator 4 and the third coupling wire 213 is placed at the other side of the vibrator 4, and thereby, the distances between the first drive wire 101 and second drive wire 102 and the external output wire 103 may be made larger. Accordingly, the parasitic capacitances produced between the first drive wire 101 and second drive wire 102 and the external output wire 103 are reduced and the vibrator device 1 with good frequency-power characteristics may be provided.

Further, the first coupling wire 211 and the second coupling wire 212 are placed at the outside of the first side 4A of the vibrator 4, i.e., the minus side in the X direction of the first side 4A of the vibrator 4 with respect to the vibrator 4 in the plan view.

On the other hand, the third coupling wire 213 is placed at the outside of the second side 4B placed to face the first side 4A of the vibrator 4, i.e., the plus side in the X direction of the second side 4B of the vibrator 4 with respect to the vibrator 4 in the plan view.

As described above, in the plan view, the first coupling wire 211 and the second coupling wire 212 are placed at the outside of the first side 4A of the vibrator 4 and the third coupling wire 213 is placed at the outside of the second side 4B placed to face the first side 4A of the vibrator 4, and thereby, the distances between the first drive wire 101 and second drive wire 102 and the external output wire 103 may be made larger. Accordingly, the parasitic capacitances produced between the first drive wire 101 and second drive wire 102 and the external output wire 103 are reduced and the vibrator device 1 with good frequency-power characteristics may be provided.

Next, the position relationship between the first coupling terminal 321 and second coupling terminal 322 formed on the semiconductor element 3 and the third coupling terminal 323 formed on the semiconductor element 3 will be explained.

In the embodiment, the first coupling terminal 321 and the second coupling terminal 322 are placed at the first side 3A side of the semiconductor element 3 in the plan view. The first coupling terminal 321 and the second coupling terminal 322 are placed along the Y directions in the plan view.

The third coupling terminal 323 is placed at the second side 3B side placed to face the first side 3A of the semiconductor element 3 in the plan view. The third coupling terminal 323 is placed in a corner portion in which the second side 3B of the semiconductor element 3 and the fourth side 3D coupling the first side 3A and the second side 3B of the semiconductor element 3 cross in the plan view.

The first coupling terminal 321 and the second coupling terminal 322 are placed at the minus side in the X direction of the center line L1 passing through the center point P1 of the vibrator 4 and extending along the Y directions in the plan view.

On the other hand, the third coupling terminal 323 is placed at the plus side in the X direction of the center line L1 passing through the center point P1 of the vibrator 4 in the plan view.

In other words, in the plan view, the first coupling terminal 321 and the second coupling terminal 322 are placed at one side of the vibrator 4, i.e., the minus side in the X direction of the center line L1 passing through the center point P1 of the vibrator 4. Further, the third coupling terminal 323 is placed at the other side of the vibrator 4, i.e., the plus side in the X direction of the center line L1 passing through the center point P1 of the vibrator 4.

As described above, in the plan view, the first coupling terminal 321 and the second coupling terminal 322 are placed at one side of the vibrator 4 and the third coupling terminal 323 is placed at the other side of the vibrator 4, and thereby, the distances between the first drive wire 101 and second drive wire 102 and the external output wire 103 may be made larger. Accordingly, the parasitic capacitances produced between the first drive wire 101 and second drive wire 102 and the external output wire 103 are reduced and the vibrator device 1 with good frequency-power characteristics may be provided.

Further, the first coupling terminal 321 and the second coupling terminal 322 are placed at the outside of the first side 4A of the vibrator 4, i.e., the minus side in the X direction of the first side 4A of the vibrator 4 with respect to the vibrator 4 in the plan view.

On the other hand, the third coupling terminal 323 is placed at the outside of the second side 4B placed to face the first side 4A of the vibrator 4, i.e., the plus side in the X direction of the second side 4B of the vibrator 4 with respect to the vibrator 4 in the plan view.

As described above, in the plan view, the first coupling terminal 321 and the second coupling terminal 322 are placed at the outside of the first side 4A of the vibrator 4 and the third coupling terminal 323 is placed at the outside of the second side 4B placed to face the first side 4A of the vibrator 4, and thereby, the distances between the first drive wire 101 and second drive wire 102 and the external output wire 103 may be made larger. Accordingly, the parasitic capacitances produced between the first drive wire 101 and second drive wire 102 and the external output wire 103 are reduced and the vibrator device 1 with good frequency-power characteristics may be provided.

Next, the mold portion M will be explained.

The mold portion M is placed on the base 2. The semiconductor element 3 and the vibrator 4 are covered by the mold portion M. The respective units of the vibrator device 1 including the semiconductor element 3 and the vibrator 4 may be protected from water, dust, impact, etc. by the mold portion M. The material forming the mold portion M is not particularly limited. As the material forming the mold portion M, e.g. a thermosetting resin such as epoxy resin may be used. The mold portion M may be formed using e.g. compression molding.

As described above, the following effects may be obtained according to the embodiment.

The vibrator device 1 includes the base 2, the semiconductor element 3, and the vibrator 4 sequentially stacked. The semiconductor element 3 is flip-chip mounted on the base 2, the vibrator 4 is mounted on the semiconductor element 3 via the adhesive D1, the first coupling wire 211 is formed on the base 2, the semiconductor element 3 and the first coupling wire 211 are electrically coupled via the first bump B1, the first coupling wire 211 and the vibrator 4 are electrically coupled via the first wire W1, and the semiconductor element 3 and the vibrator 4 are covered by the mold portion M placed on the base 2.

Thereby, the distance between the end portion of the semiconductor element 3 and the first coupling electrode E1 coupled to the first wire W1 of the first coupling wire 211 may be made shorter, and further downsizing of the vibrator device 1 may be realized.

2. Embodiment 2

Next, the vibrator device 1 according to embodiment 2 will be explained with reference to FIGS. 1 and 2.

The vibrator device 1 of embodiment 2 is the same as that of embodiment 1 except that the semiconductor substrate 31 of the semiconductor element 3 is coupled to a ground potential. Note that the same configurations as those of embodiment 1 have the same signs and the overlapping explanation will be omitted.

In the embodiment, the semiconductor substrate 31 of the semiconductor element 3 is coupled to a ground potential. For example, the semiconductor substrate 31 and the fourth coupling terminal 324 as the ground terminal shown in FIG. 2 are electrically coupled via an internal wire (not shown) provided within the circuit unit 32, and thereby, the semiconductor substrate 31 may be coupled to the ground potential. The semiconductor substrate 31 coupled to the ground potential corresponds to a constant potential layer held at a constant potential. That is, the semiconductor element 3 has the semiconductor substrate 31 as the constant potential layer held at the constant potential.

In the embodiment, for example, the semiconductor substrate 31 is placed between the first electrode terminal 63 and second electrode terminal 64 formed on the upper surface of the vibrator 4 and the third coupling wire 213 formed on the upper surface of the base 2. That is, for example, the semiconductor substrate 31 as the constant potential layer is placed between the first electrode terminal 63 of the first drive wire 101 and second electrode terminal 64 of the second drive wire 102 and the third coupling wire 213 of the external output wire 103.

As described above, the semiconductor substrate 31 as the constant potential layer is placed between at least a part of the first drive wire 101 and the second drive wire 102 and at least a part of the external output wire 103, and thereby, at least a part of an electric field generated between the first drive wire 101 and second drive wire 102 and the external output wire 103 may be shielded by the semiconductor substrate 31. At least a part of the electric field generated between the first drive wire 101 and second drive wire 102 and the external output wire 103 is shielded, and thereby, parasitic capacitances produced between the first drive wire 101 and second drive wire 102 and the external output wire 103 are reduced. Therefore, the vibrator device 1 with good frequency-power characteristics may be provided.

In the embodiment, the semiconductor substrate 31 coupled to the ground potential is the constant potential layer, however, the constant potential layer is not necessarily the semiconductor substrate 31. For example, a conductive layer coupled to the ground potential may be placed on the upper surface, the lower surface, or inside of the semiconductor element 3 and the conductive layer may be used as the constant potential layer.

As described above, according to the embodiment, the following effects may be obtained in addition to the effects in embodiment 1.

By the semiconductor substrate 31 as the constant potential layer of the semiconductor element 3, the parasitic capacitances produced between the first drive wire 101 and second drive wire 102 and the external output wire 103 are reduced, and thereby, the vibrator device 1 with good frequency-power characteristics may be provided.

3. Embodiment 3

Next, a vibrator device **1*b* according to embodiment 3 will be explained with reference to FIGS. 6, 7, and 8. In FIG. 7**, for convenience of explanation, the mold portion M is transparently shown.

The vibrator device **1*b* of embodiment 3 is the same as that of embodiment 1 except that a base 2*b*** is formed by a conductive lead frame. Note that the same configurations as those of embodiment 1 have the same signs and the overlapping explanation will be omitted.

Figure 6:
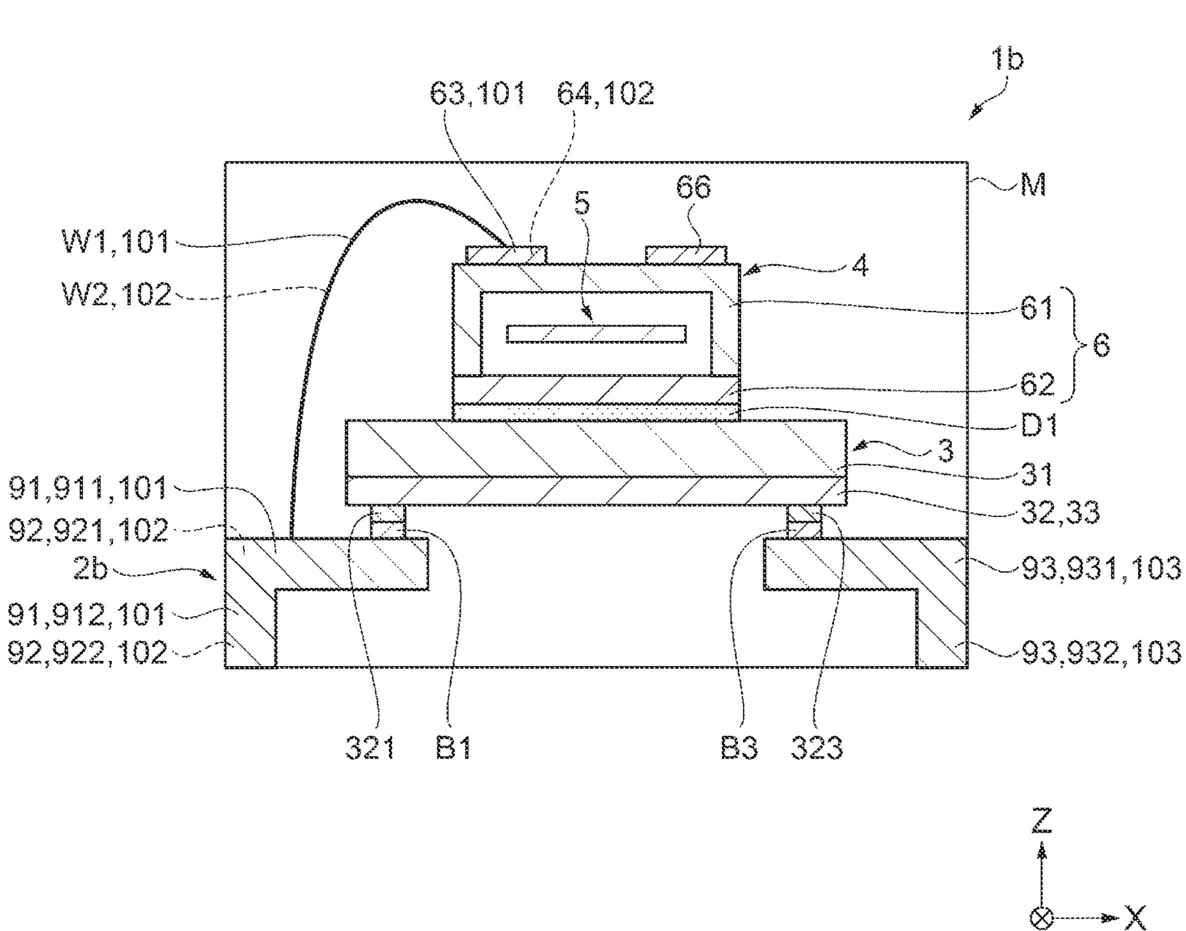
FIG. 6 is a sectional view of a vibrator device according to embodiment 3.
Figure 7:
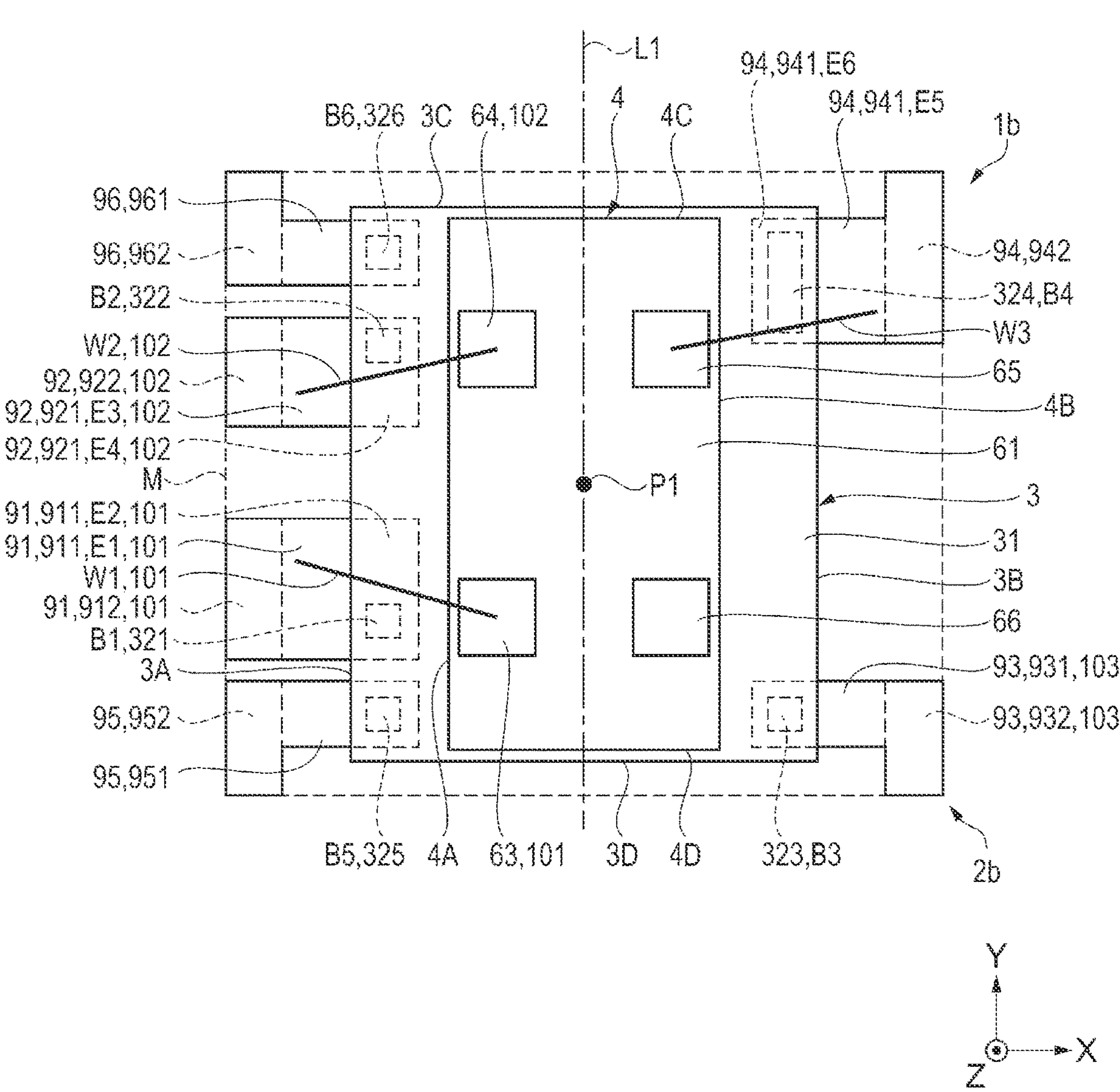
FIG. 7 is a plan view of the vibrator device according to embodiment 3.
Figure 8:
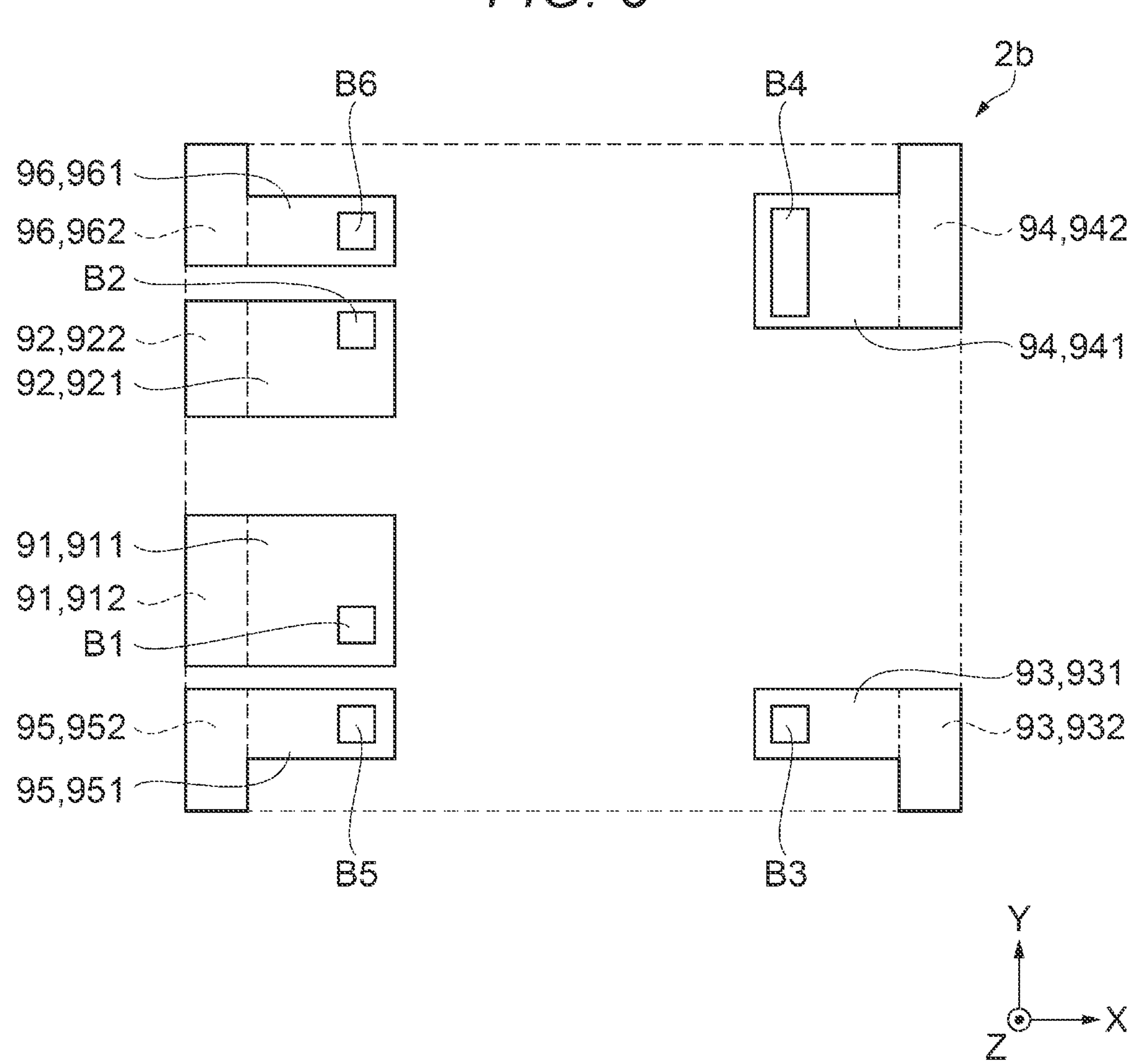
FIG. 8 is a plan view of a base according to embodiment 3.

As shown in FIGS. 6, 7, and 8, the base **2*b* is formed by the conductive lead frame. Specifically, the base 2*b* has a first lead 91, a second lead 92, a third lead 93, a fourth lead 94, a fifth lead 95, and a sixth lead 96. The first lead 91, the second lead 92, the third lead 93, the fourth lead 94, the fifth lead 95, and the sixth lead 96 have conductivity. The first lead 91, the second lead 92, the third lead 93, the fourth lead 94, the fifth lead 95, and the sixth lead 96** are formed using e.g. iron-base materials or copper-base materials.

The semiconductor element 3 is flip-chip mounted on the first lead 91, the second lead 92, the third lead 93, the fourth lead 94, the fifth lead 95, and the sixth lead 96 via the first bump B1, the second bump B2, the third bump B3, the fourth bump B4, the fifth bump B5, and the sixth bump B6, respectively.

As shown in FIGS. 7 and 8, the first lead 91 has a first inner lead portion 911 and a first outer lead portion 912.

The first inner lead portion 911 is electrically and mechanically coupled to the semiconductor element 3 via the first bump B1. The first inner lead portion 911 forms a part of the base **2*b* and corresponds to a first coupling wire. The first inner lead portion 911** is covered by the mold portion M.

The first outer lead portion 912 is provided to extend downward from an end portion of the first inner lead portion 911. The first outer lead portion 912 is exposed from the mold portion M. The first outer lead portion 912 forms a part of the base **2*b* and corresponds to an external terminal for electrically coupling the vibrator device 1*b* to the outside. Note that the first outer lead portion 912** may be omitted.

The second lead 92 has a second inner lead portion 921 and a second outer lead portion 922.

The second inner lead portion 921 is electrically and mechanically coupled to the semiconductor element 3 via the second bump B2. The second inner lead portion 921 forms a part of the base **2*b* and corresponds to a second coupling wire. The second inner lead portion 921** is covered by the mold portion M.

The second outer lead portion 922 is provided to extend downward from an end portion of the second inner lead portion 921. The second outer lead portion 922 is exposed from the mold portion M. The second outer lead portion 922 forms a part of the base **2*b* and corresponds to an external terminal for electrically coupling the vibrator device 1*b* to the outside. Note that the second outer lead portion 922** may be omitted.

The third lead 93, the fourth lead 94, the fifth lead 95, and the sixth lead 96 have a third inner lead portion 931 and a third outer lead portion 932, a fourth inner lead portion 941 and a fourth outer lead portion 942, a fifth inner lead portion 951 and a fifth outer lead portion 952, and a sixth inner lead portion 961 and a sixth outer lead portion 962, respectively.

The third inner lead portion 931, the fourth inner lead portion 941, the fifth inner lead portion 951, and the sixth inner lead portion 961 are electrically and mechanically coupled to the semiconductor element 3 via the third bump B3, the fourth bump B4, the fifth bump B5, and the sixth bump B6, respectively.

The third inner lead portion 931, the fourth inner lead portion 941, the fifth inner lead portion 951, and the sixth inner lead portion 961 form parts of the base **2*b*** and correspond to a third coupling wire, a fourth coupling wire, a fifth coupling wire, and a sixth coupling wire, respectively.

The third inner lead portion 931, the fourth inner lead portion 941, the fifth inner lead portion 951, and the sixth inner lead portion 961 are covered by the mold portion M.

The third outer lead portion 932, the fourth outer lead portion 942, the fifth outer lead portion 952, and the sixth outer lead portion 962 are provided to extend downward from end portions of the third inner lead portion 931, the fourth inner lead portion 941, the fifth inner lead portion 951, and the sixth inner lead portion 961, respectively.

The third outer lead portion 932, the fourth outer lead portion 942, the fifth outer lead portion 952, and the sixth outer lead portion 962 are exposed from the mold portion M.

The third outer lead portion 932, the fourth outer lead portion 942, the fifth outer lead portion 952, and the sixth outer lead portion 962 form parts of the base **2*b* and correspond to external terminals for electrically coupling the vibrator device 1*b* to the outside. Specifically, the third outer lead portion 932, the fourth outer lead portion 942, the fifth outer lead portion 952, and the sixth outer lead portion 962** correspond to a first external terminal, a second external terminal, a third external terminal, and a fourth external terminal, respectively.

Next, the first inner lead portion 911 as the first coupling wire, the second inner lead portion 921 as the second coupling wire, and the fourth inner lead portion 941 as the fourth coupling wire will be explained.

First, the first inner lead portion 911 as the first coupling wire will be explained.

The first inner lead portion 911 has the first coupling electrode E1 coupled to the first wire W1 and the second coupling electrode E2 bonded to the first coupling terminal 321 of the semiconductor element 3 via the first bump B1. In the embodiment, the first inner lead portion 911 is placed in a position overlapping with the first side 3A of the semiconductor element 3 in the plan view. The first coupling electrode E1 is placed adjacent to the first side 3A of the semiconductor element 3 in the plan view. As described above, the distance between an end portion of the semiconductor element 3 bonded to the base 2*b* and the first coupling electrode E1 provided on the base 2*b* may be made shorter, and further downsizing of the vibrator device 1*b* may be realized.

Next, the second inner lead portion 921 as the second coupling wire will be explained.

The second inner lead portion 921 has the third coupling electrode E3 bonded to the second wire W2 and the fourth coupling electrode E4 bonded to the second coupling terminal 322 of the semiconductor element 3 via the second bump B2. In the embodiment, the second inner lead portion 921 is placed in a position overlapping with the first side 3A of the semiconductor element 3 in the plan view. The third coupling electrode E3 is placed adjacent to the first side 3A of the semiconductor element 3 in the plan view. As described above, the distance between an end portion of the semiconductor element 3 bonded to the base 2*b* and the third coupling electrode E3 provided on the base 2*b* may be made shorter, and further downsizing of the vibrator device 1*b* may be realized.

Next, the fourth inner lead portion 941 as the fourth coupling wire will be explained.

The fourth inner lead portion 941 has the fifth coupling electrode E5 bonded to the third wire W3 and the sixth coupling electrode E6 bonded to the fourth coupling terminal 324 of the semiconductor element 3 via the fourth bump B4. In the embodiment, the fourth inner lead portion 941 is placed in a position overlapping with the second side 3B of the semiconductor element 3 in the plan view. The fifth coupling electrode E5 is placed adjacent to the second side 3B of the semiconductor element 3 in the plan view. As described above, the distance between an end portion of the semiconductor element 3 bonded to the base 2*b* and the fifth coupling electrode E5 provided on the base 2*b* may be made shorter, and further downsizing of the vibrator device 1*b* may be realized.

As above, the first inner lead portion 911 as the first coupling wire, the second inner lead portion 921 as the second coupling wire, and the fourth inner lead portion 941 as the fourth coupling wire are explained.

Next, the first drive wire 101, the second drive wire 102, and the external output wire 103 of the vibrator device 1*b* will be explained.

As shown in FIGS. 6 and 7, in the embodiment, the first drive wire 101 has the first electrode terminal 63 formed on the vibrator 4, the first lead 91 of the base 2*b*, and the first wire W1 electrically coupling the first electrode terminal 63 and the first lead 91.

The second drive wire 102 has the second electrode terminal 64 formed on the vibrator 4, the second lead 92 of the base 2*b*, and the second wire W2 electrically coupling the second electrode terminal 64 and the second lead 92. The external output wire 103 has the third lead 93. As described above, the third lead 93 has the third inner lead portion 931 as the third coupling wire and the third outer lead portion 932 as the first external terminal.

As above, the first drive wire 101, the second drive wire 102, and the external output wire 103 are explained.

Next, a position relationship between the first inner lead portion 911 as the first coupling wire and second inner lead portion 921 as the second coupling wire and the third inner lead portion 931 as the third coupling wire will be explained.

In the embodiment, the first inner lead portion 911 as the first coupling wire and the second inner lead portion 921 as the second coupling wire are placed side by side in the Y directions in the plan view.

The first inner lead portion 911 and the second inner lead portion 921 are placed at the minus side in the X direction of the center line L1 passing through the center point P1 of the vibrator 4 and extending along the Y directions in the plan view.

On the other hand, the third inner lead portion 931 is placed at the plus side in the X direction of the center line L1 passing through the center point P1 of the vibrator 4 in the plan view.

In other words, in the plan view, the first inner lead portion 911 and the second inner lead portion 921 are placed at one side of the vibrator 4, i.e., the minus side in the X direction of the center line L1 passing through the center point P1 of the vibrator 4. Further, the third inner lead portion 931 is placed at the other side of the vibrator 4, i.e., the plus side in the X direction of the center line L1 passing through the center point P1 of the vibrator 4.

As described above, in the plan view, the first inner lead portion 911 and the second inner lead portion 921 are placed at one side of the vibrator 4 and the third inner lead portion 931 is placed at the other side of the vibrator 4, and thereby, the distances between the first drive wire 101 and second drive wire 102 and the external output wire 103 may be made larger. Accordingly, the parasitic capacitances produced between the first drive wire 101 and second drive wire 102 and the external output wire 103 are reduced and the vibrator device 1 with good frequency-power characteristics may be provided.

Further, the first inner lead portion 911 and the second inner lead portion 921 are placed at the outside of the first side 4A of the vibrator 4, i.e., the minus side in the X direction of the first side 4A of the vibrator 4 with respect to the vibrator 4 in the plan view.

On the other hand, the third inner lead portion 931 is placed at the outside of the second side 4B placed to face the first side 4A of the vibrator 4, i.e., the plus side in the X direction of the second side 4B of the vibrator 4 with respect to the vibrator 4 in the plan view.

As described above, in the plan view, the first inner lead portion 911 and the second inner lead portion 921 are placed at the outside of the first side 4A of the vibrator 4 and the third inner lead portion 931 is placed at the outside of the second side 4B placed to face the first side 4A of the vibrator 4, and thereby, the distances between the first drive wire 101 and second drive wire 102 and the external output wire 103 may be made larger. Accordingly, the parasitic capacitances produced between the first drive wire 101 and second drive wire 102 and the external output wire 103 are reduced and the vibrator device 1*b* with good frequency-power characteristics may be provided.

As described above, the following effects may be obtained according to the embodiment.

The vibrator device 1*b* includes the base 2*b*, the semiconductor element 3, and the vibrator 4 sequentially stacked. The semiconductor element 3 is flip-chip mounted on the base 2*b*, the vibrator 4 is mounted on the semiconductor element 3 via the adhesive D1, the semiconductor element 3 and the base 2*b* are electrically coupled via the first bump B1, the base 2*b* and the vibrator 4 are electrically coupled via the first wire W1, and the semiconductor element 3 and the vibrator 4 are covered by the mold portion M placed on the base 2*b*.

Thereby, the distance between the end portion of the semiconductor element 3 and the first coupling electrode E1 coupled to the first wire W1 of the first inner lead portion 911 may be made shorter, and further downsizing of the vibrator device 1*b* may be realized.

That is, even when the base 2*b* is formed using a conductive base frame, the same effects as those of embodiment 1 may be obtained.

As above, the vibrator devices 1, 1*b* are explained based on embodiments 1 to 3. Note that the present disclosure is not limited to those, but the configurations of the respective parts may be replaced by any configurations having the same functions. Further, any other configuration may be added to the present disclosure. Furthermore, the respective embodiments may be appropriately combined.

What is claimed is:

1. A vibrator device comprising:

a base;

a semiconductor element flip-chip mounted on the base;

a vibrator mounted on the semiconductor element via an adhesive;

a first coupling wire formed on the base;

a first bump electrically coupling the semiconductor element and the first coupling wire;

a first wire electrically coupling the first coupling wire and the vibrator; and a mold portion placed on the base and covering the semiconductor element and the vibrator, wherein an external output terminal is formed on the base, the semiconductor element is electrically coupled to the external output terminal, the vibrator has a first excitation electrode, and the first coupling wire and the first excitation electrode are electrically coupled via the first wire, wherein the semiconductor element is mounted on the base via a second bump and a third bump, a second coupling wire and a third coupling wire are formed on the base, the semiconductor element is electrically coupled to the second coupling wire via the second bump and electrically coupled to the third coupling wire via the third bump, the vibrator has a second excitation electrode, the second coupling wire and the second excitation electrode are electrically coupled via a second wire, the third coupling wire is electrically coupled to the external output terminal, and in a plan view, the first coupling wire and the second coupling wire are placed at one side of the vibrator and the third coupling wire is placed at the other side of the vibrator.

2. The vibrator device according to claim 1, wherein the semiconductor element has a first coupling terminal electrically coupled to the first coupling wire, a second coupling terminal electrically coupled to the second coupling wire, and a third coupling terminal electrically coupled to the third coupling wire, and in the plan view, the first coupling terminal and the second coupling terminal are placed at the one side of the vibrator and the third coupling terminal is placed at the other side of the vibrator.

3. The vibrator device according to claim 2, wherein the semiconductor element has a constant potential layer held at a constant potential.

4. A vibrator device comprising:

a base;

a semiconductor element flip-chip mounted on the base;

a vibrator mounted on the semiconductor element via an adhesive;

a first bump electrically coupling the semiconductor element and the base;

a first wire electrically coupling the base and the vibrator; and a mold portion placed on the base and covering the semiconductor element and the vibrator, wherein the semiconductor element is mounted on the base via a second bump and a third bump, an external output terminal is formed on the base, the semiconductor element is electrically coupled to the external output terminal, the second bump and the third bump electrically coupling the semiconductor element and the base, the vibrator has a first excitation electrode and a second excitation electrode, the base and the first excitation electrode are electrically coupled via the first wire, and the base and the second excitation electrode are electrically coupled via a second wire.

* * * * *